April 21, 1964 T. N. ROSS 3,130,376

WIDE RANGE SIGNAL GENERATOR

Filed March 19, 1962 4 Sheets-Sheet 1

INVENTOR:
Thomas N. Ross
By Keith D. Beecher
Attorney

INVENTOR:
Thomas N. Ross
By Keith D Beecher
Attorney

April 21, 1964 T. N. ROSS 3,130,376

WIDE RANGE SIGNAL GENERATOR

Filed March 19, 1962 4 Sheets-Sheet 3

INVENTOR:
Thomas N. Ross
By Keith D. Beecher
Attorney

WIDE RANGE SIGNAL GENERATOR

Filed March 19, 1962 4 Sheets-Sheet 4

INVENTOR:
Thomas N. Ross
By Keith D. Beecher
Attorney

United States Patent Office 3,130,376
Patented Apr. 21, 1964

3,130,376

WIDE RANGE SIGNAL GENERATOR

Thomas N. Ross, Temple City, Calif., assignor to Hull Instruments, Inc., South Pasadena, Calif., a corporation of California Filed Mar. 19, 1962, Ser. No. 180,651
2 Claims. (Cl. 331—18)

The present invention relates to signal generators, and it relates more particularly to an improved highly accurate and stable oscillator which may be adjusted throughout a wide range of operating frequencies.

The improved signal generator, or oscillator, of the invention is predicated on phase-locked closed loop principles and techniques, and it utilizes these principles and techniques to provide a signal generator capable of producing alternating current signals throughout a wide range of signal frequencies. The frequency range of the instrument may extend, for example, through the audio and telemetry ranges.

The signal generator to be described herein includes a voltage controlled variable frequency oscillator and a reference precision oscillator. These oscillators in the described embodiment are pulse generators. The voltage controlled oscillator may be a usual astable multivibrator, and the precision oscillator may be a crystal controlled pulse generator of any known stable type. The voltage controlled oscillator is phase-locked with the reference oscillator by an automatic phase control circuit in a closed loop system. An adjustable frequency divider is included in the loop to control the frequency of the voltage controlled oscillator, and, therefore, of the output signal of the signal generator, as will be described in detail in the following specification.

The embodiment of the invention to be described is a digital controllable signal generator. The signal generator, as mentioned above, is adjustable throughout a wide range of frequencies, and it exhibits all the accuracy and stability of a crystal oscillator at any particular frequency to which it may be set.

The particular embodiment of the invention to be described is set to any particular frequency in each of a plurality of ranges by digital means. That is, a plurality of digital controls are provided, so that any desired frequency in a particular range may be obtained, merely by setting the digital controls to a calibrated setting corresponding to that frequency.

The signal generator to be described herein is of the pulse generating type. However, it will be apparent that by the provision of suitable known filters, or other known types of components, the signal generator may be adapted to generate sine waves, square waves, or any other desired type of waveform.

A constructed embodiment of the invention is composed in its entirety of solid state devices, such as transistors and diodes. This constructed embodiment exhibits a frequency range of from 0.001 c.p.s. to 1 megacycle; a frequency accuracy of $\pm$.0005% (as compared with a 1–2% accuracy of most prior art systems); and a setting ability to five significant digits. It is to be understood, of course, that the above parameters of the constructed embodiment are listed herein merely by way of example, and they are not intended to limit the invention in any way.

An object of the invention, therefore, is to provide an improved signal generator which is accurate and stable in its operation, and which may be set to any desired signal frequency throughout a wide frequency range.

Another object is to provide such an improved signal generator which is relatively simple in its construction, light in weight, compact in size, and relatively low in cost.

Yet another object is to provide such an improved signal generator which can be operated easily and conveniently, and which can be readily set and re-set to any desired frequency within a wide range of signal frequencies.

Other objects and advantages of the invention will become apparent from a consideration of the following specification, when the specification is considered in conjunction with the accompanying drawings, in which.

The system of the present invention includes a phase comparator, or phase detector, circuit which is included in a closed feedback loop system with an adjustable frequency divider. The adjustable frequency divider, as will be explained, is controlled in a digital manner to cause a voltage controlled oscillator to be precisely maintained by a reference oscillator at any selected frequency throughout a wide frequency range.

A closed loop feedback system in the signal generator of the invention tends to maintain a reference signal from the reference oscillator and a primary feedback signal from the frequency divider at precisely the same frequency and 90° out of phase. Any shift in this relationship between the two signals causes the amplitude of the control signal produced by the closed loop feedback system to change. This latter signal is applied to a voltage controlled oscillator in the signal generator, and any change in its amplitude causes the frequency of the voltage controlled oscillator to change in a direction to compensate for any tendency of the frequency to vary from the set value.

The control signal in the closed feedback loop of the system causes the voltage controlled oscillator to oscillate at a frequency precisely $n$ times the frequency of the reference oscillator; where $n$ is the division factor set into the adjustable frequency divider.

In the embodiment to be described, the frequency divider is in the form of a pre-set pulse counter. This pulse counter may be set, for example, to divide by any integral number of from 10,000 to 100,000. This permits the voltage controlled oscillator to oscillate at any set frequency in a frequency range of between 100 kilocycles and 1 megacycle. In each instance, the set frequency of the voltage controlled oscillator is produced and held with the accuracy and stability of the crystal controlled reference oscillator.

The pre-set counter of the frequency divider in the embodiment referred to above is controlled manually by a plurality of front panel digital dial type control switches. It will become evident as the description proceeds, however, that the control may be effectuated by electronic or other means in response to appropriate control signals.

In the embodiment to be described, the frequency is controlled in a digital manner to five significant digits, and for this purpose, five separate digital control dials are provided. It will be understood that each dial may be set to ten different positions when the digital setting is in accordance with the usual decimal numeric system. The decimal point in the output signal may be moved to the left or right by the selective insertion or removal of decade dividers in the output circuit of the signal generator, this being achieved by appropriate selective range switching means, as will be described.

Figure 1:
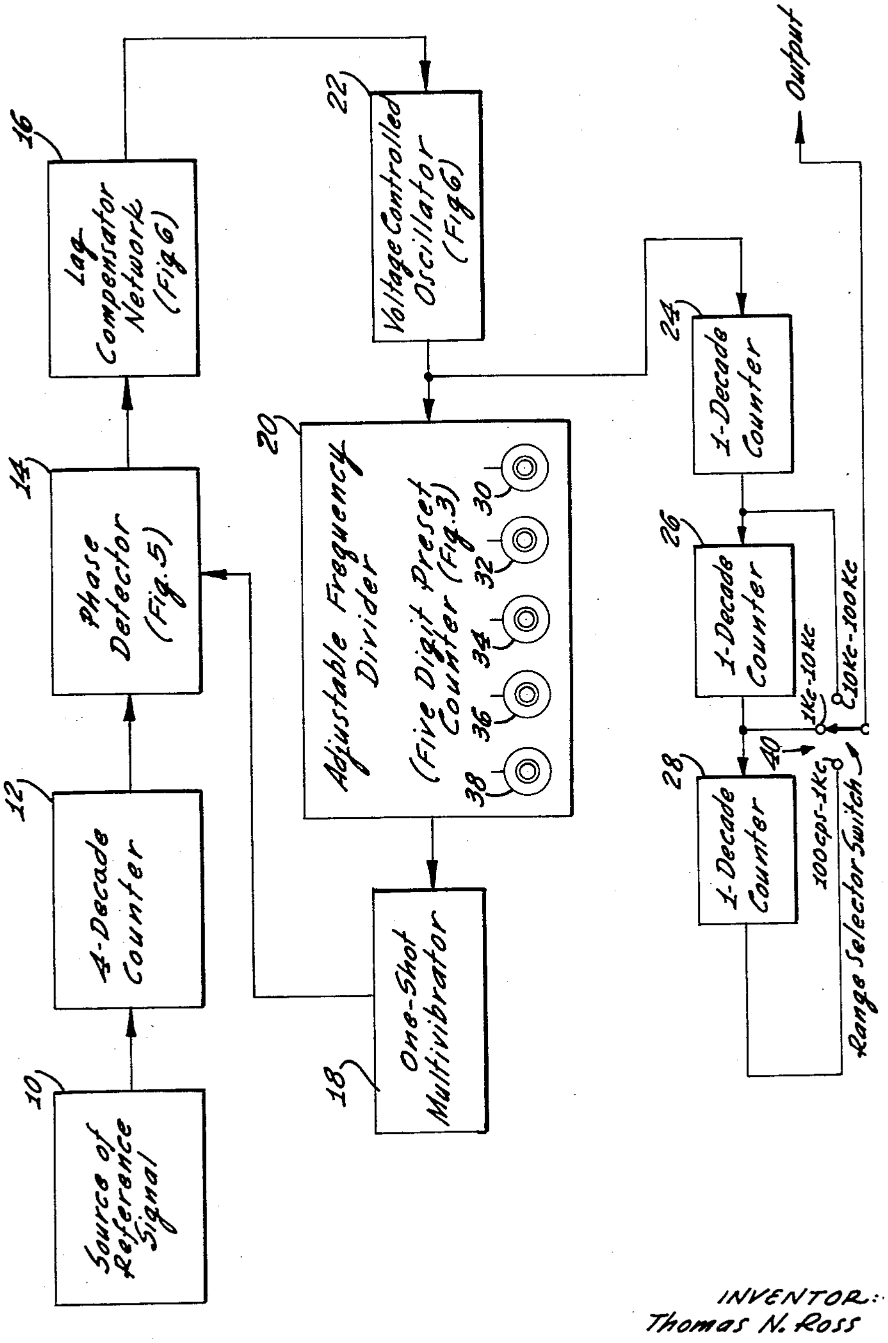
FIGURE 1 is a block diagram of a signal generator representative of one embodiment of the present invention.

The embodiment of the invention shown in block form in FIGURE 1 includes a source 10 of the reference signal. This source may be any appropriate crystal controlled oscillator exhibiting the desired characteristics of accuracy and stability. The oscillator 10 may produce, for example, a pulse signal having a repetition frequency of 100,000 kilocycles.

The output signal from the oscillator 10 is applied to a decade counter 12. This decade counter may include four decades, so as to provide a frequency division of the order of $10^4$ to the signal output from the reference source 10. Decade counters, such as the counter 12, are extremely well known to the art, and may take the form of any appropriate binary counter constructed to provide the desired frequency division.

The output from the counter 12 has a repetition frequency, for example, of 10,000 c.p.s., and this signal has all the accuracy and stability of the signal from the source 10. The output signal from the counter 12 is applied to a phase detector 14 to constitute the reference signal of the system. The phase detector 14 will be described in more detail in conjunction with FIGURE 5.

The phase detector 14 is coupled to a lag compensator network 16 which, in turn, is coupled to a voltage controlled oscillator 22. The lag compensator 16 and voltage controlled oscillator 22 will be described in detail in FIGURE 6. The lag compensator 16 is included in the system to give the phase-lock closed feedback loop a desired second order characteristic. As will also be described in conjunction with FIGURE 6, the voltage controlled oscillator 22 is an astable multivibrator which is controlled in the manner to be described.

The voltage controlled oscillator 22 applies its output signal to an adjustable frequency divider 20. In the illustrated embodiment, the frequency divider 20 is a five digit pre-set counter and associated logic circuitry, as will be described in more detail in FIGURE 3. The output of the frequency divider 20 is applied to a suitable pulse forming circuit, such as a one-shot multivibrator 18 of usual construction. The resulting pulses from the multivibrator 18 constitute the primary feedback pulses of the closed feedback loop, and these are applied to the phase detector 14.

It will be appreciated that the phase detector 14, the loop filter 16, the voltage controlled oscillator 22, the adjustable frequency divider 20 and the one-shot multivibrator 18 form the closed feedback loop in the system of the invention.

The output of the signal generator of FIGURE 1 is derived from the voltage controlled oscillator 22. This output is passed through a series of decade counters 24, 26 and 28. As mentioned above, these decade counters serve to control the decimal point of the frequency of the alternating current output signal of the signal generator. The decade counters 24, 26 and 28 are selectively switched into circuit by means of a range selector switch 40.

When the selector switch 40 is in a first position, the decade counter 24 only is in the circuit, so that the output signal is in a frequency range of, for example, 10 kilocycles to 100 kilocycles. When the selector switch 40 is in a second position, both the decade counters 24 and 26 are in the output circuit, and the output signal is set in a frequency range of, for example, 1 kilocycle to 10 kilocycles. When the range selector switch 40 is in a third position, all three decade counters 24, 26 and 28 are switched into the output circuit, and the output signal is in a frequency range of 100 c.p.s.–1 kilocycle, for example.

The adjustable frequency divider 20 has a plurality of dials 30, 32, 34, 36, 38 mounted on the front panel of the instrument. These dials are calibrated, for example, from 0–9, and each represents a different decimal digit in a five digit pre-set counter system. The division ratio of the unit 20 can be set, as will be described in more detail in conjunction with FIGURE 3, by an appropriate setting of the dials. The selected frequency of the reference oscillator and calibration may be such that the setting of the dials corresponds directly to the resulting frequency of the output signal (on the decimal system base) with the setting of the selector switch 40 determining the position of the decimal point in the frequency of the resulting output signal.

Figure 2A:
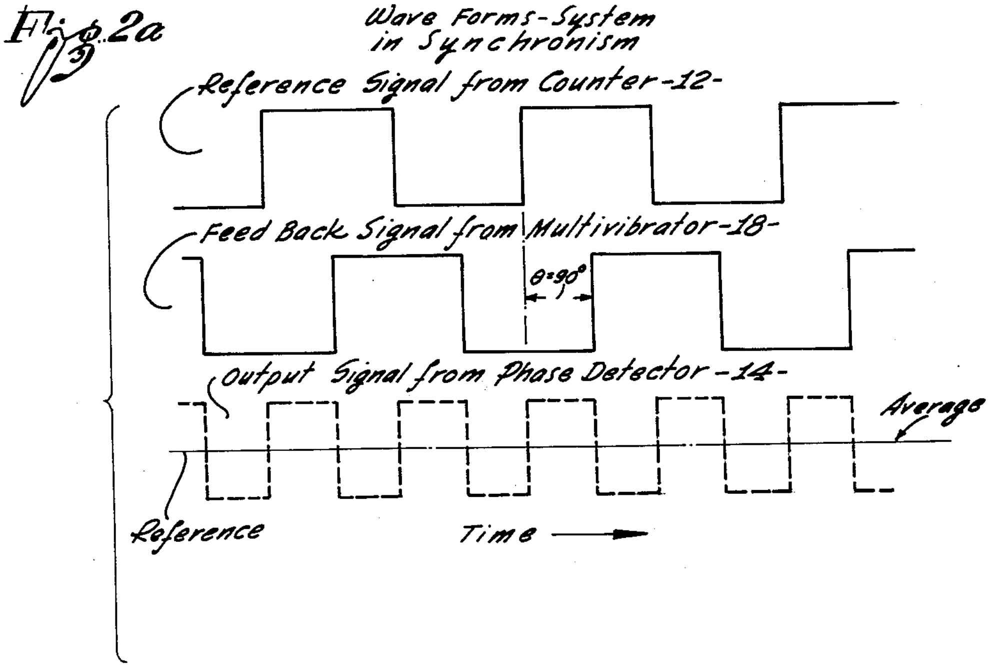
FIGURES 2A and 2B are waveforms useful in explaining the manner in which certain components of the system of FIGURE 1 are synchronized with one another.
Figure 2B:
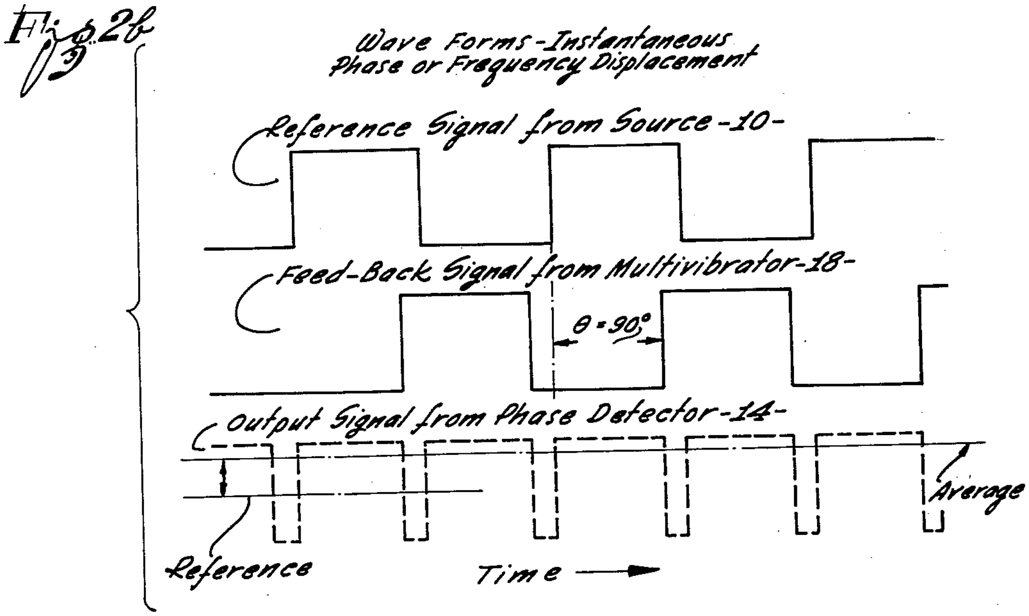

In the operation of the system of FIGURE 1, and as shown in FIGURES 2A and 2B, the reference signal from the source 10, appropriately divided by the counter 12, may have the wave shape shown in the upper curve in each of the FIGURES 2A and 2B. The dials on the adjustable frequency divider 20, and the range selector switch 40 are set to the desired output signal frequency.

When the system is in synchronism, the frequency of the output pulse signal from the voltage controlled oscillator 22 is divided by the frequency divider 20 to cause the multivibrator 18 to provide a feedback pulse signal, such as shown by the center curve in FIGURE 2A. For synchronism, this feedback pulse signal has precisely the frequency of the reference signal from the decade counter 12 and is displaced 90° in phase with respect thereto, as shown ($\theta=90°$). This means, of course, that the voltage controlled oscillator 22 operates at a frequency which is some multiple of the frequency of the reference signal from the decade counter 12, as determined by the setting of the frequency divider 20.

When the system is in synchronism, the signal produced by the phase detector 14 has the form shown in the lower curve of FIGURE 2A, and this signal provides a direct current control signal for the voltage controlled oscillator 22. The direct current control signal has an amplitude corresponding to the average amplitude of the signal produced by the phase detector 14, and this control signal serves to drive the voltage controlled oscillator 22 at the set frequency. The resulting direct current signal applied to the voltage controlled oscillator 22 has the required amplitude to cause the voltage controlled oscillator to oscillate precisely at the set frequency. The closed feedback loop system of the invention controls this voltage in a manner such that any tendency for the frequency of the voltage controlled oscillator 22 to depart from the required frequency causes the direct current voltage to change in a direction to compensate for such tendency.

As shown in FIGURE 2B, any tendency for the frequency of the controlled oscillator 22 to change causes the phase angle $\theta$ to change from the 90° relationship. This immediately causes the amplitude of the direct current control voltage applied to the voltage controlled oscillator 22 to change in a direction to restore the 90° phase relationship and maintain the voltage controlled oscillator at the set frequency.

The system operates in a manner such that the voltage controlled oscillator 22 may be shifted through the desired frequency range, and it may be set to operate at any desired frequency within the range. Any setting of the voltage controlled oscillator 22 is controlled by the system, so that the voltage controlled oscillator 22 exhibits all the stability and accuracy of the reference source 10 at the desired frequency.

As noted above, the adjustable frequency divider 20 of FIGURE 1 includes a five-digit pre-set counter arrangement and associated logic circuitry and components. The various circuits and components which make up the adjustable frequency divider 20 are illustrated in FIGURE 3.

Figures 3, 4:
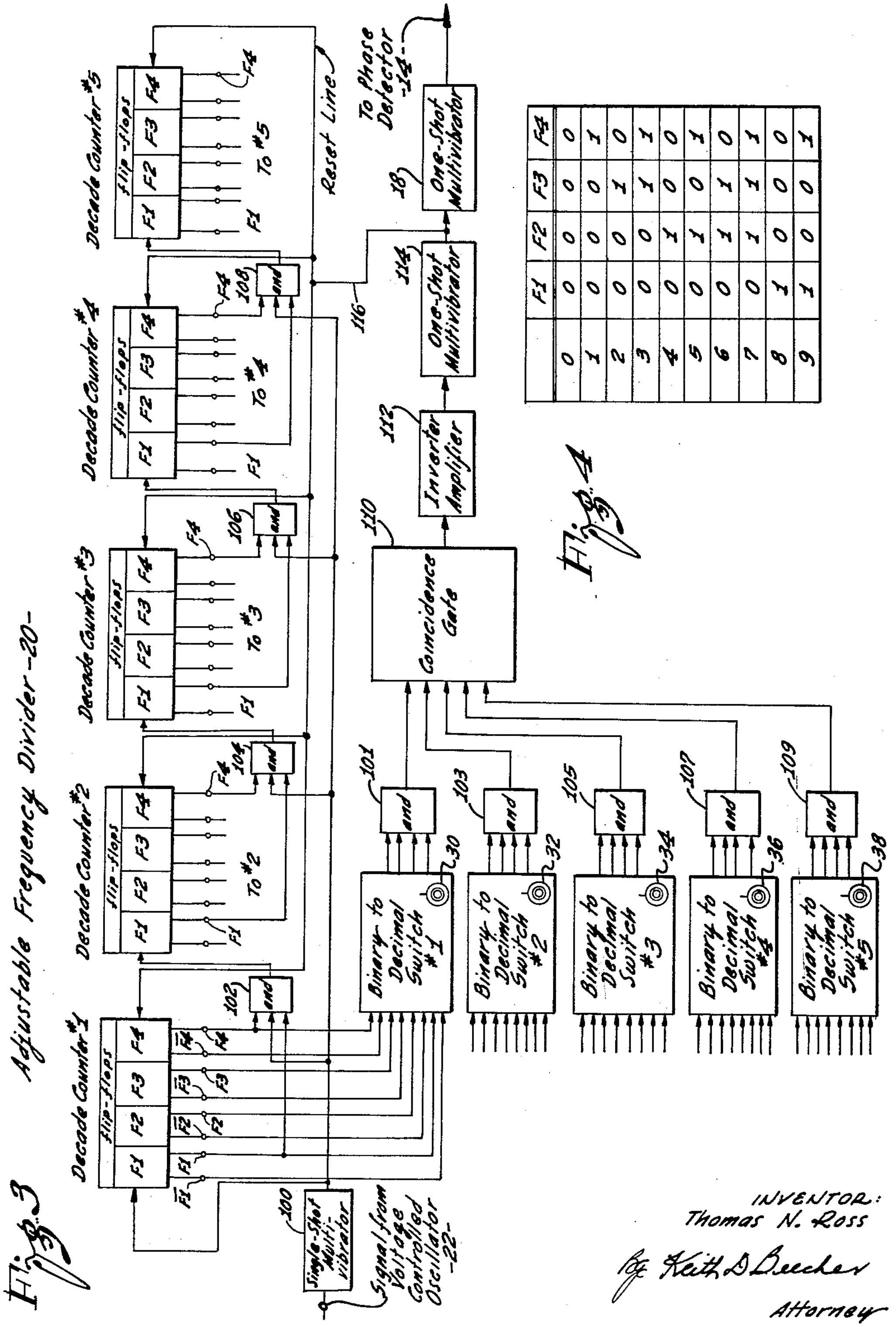
FIGURE 3 is a logic block diagram of one of the components of the signal generator of FIGURE 1.
FIGURE 4 is a table illustrating the states of various flip-flops included in individual counters of the component of FIGURE 3.

As shown in FIGURE 3, the adjustable frequency divider includes a group of five binary decade counters.

These decade counters are connected in usual manner, and are illustrated schematically as individually comprising flip-flops F1–F4. The different decade counters are designated in FIGURE 3 as decade counter #1, decade counter #1, and so on. The decade counters are designated as such, because they are used to count in the binary coded equivalent of the decimal base system from 1 to 10.

The feedback signal from the voltage controlled oscillator 22 is applied to a single-shot multivibrator 100 in the system of FIGURE 3. This feedback signal, as described above, is a pulse signal. The single-shot multivibrator 100 may be constructed in any known manner, and it serves to form the feedback signal from the voltage controlled oscillator 22 into discrete sharp pulses.

The output pulses from the single-shot multivibrator 100 are applied to the decade counter #1 in the frequency divider 20. Each successive pulse from the multivibrator 100 causes the decade counter #1 to be triggered from one configuration to the next. The output pulses from the single-shot multivibrator 100 are also applied to each of a plurality of "and" gates 102, 104, 106 and 108 in the system of FIGURE 3. These "and" gates may be of any appropriate form, and are well known to the electronic digital computer and data processor art. As is well known, an "and" gate responds to a plurality of input terms to provide an output term when all the input terms are true.

The output from the "and" gate 102 is applied to the decade counter #2 in the divider 20. The control is such, as will be explained, that the pulses from the single-shot multivibrator 100 are applied to the decade counter #2 to commence the actuation thereof after the decade counter #1 has reached a configuration corresponding to "10" in the decimal system base.

In like manner, the "and" gate 104 is controlled to apply the pulses from the single-shot multivibrator 100 to the decade counter #3 after the decade counter #2 has reached a configuration corresponding to the "100" level in the decimal base system. The "and" gate 106, likewise, is caused to control the actuation of the decade counter #4, after the decade counter #3 has reached a configuration corresponding to "1,000" in the decimal base system. Finally, the "and" gate 108 is controlled to cause the pulses from the single-shot multivibrator 100 to actuate the decade counter #5 after the decade counter #4 has reached a count corresponding to "10,000" in the decimal base system.

As explained above, each of the decade counters #1–#5 include a plurality of flip-flops designated F1–F4. The interconnections between the flip-flops in each decade counter is such that the counter returns to the 0000 configuration after a configuration corresponding to "10" in the decimal base system is reached.

As shown by the table of FIGURE 4, the decimal numeric configurations of each of the counters #1–#5 correspond to the illustrated configurations of the individual flip-flops in the individual counters. As shown in FIGURE 4, the decimal "10" configuration corresponds to a 1001 configuration of the flip-flops in the counter. This latter configuration in any one of the counters causes the corresponding one of the "and" gates 102, 104, 106 or 108 to become conductive, so that actuation of the next succeeding counter may commence.

For example, absent any additional control, the incoming feedback pulse signal causes the single-shot multivibrator 100 initially to introduce a series of pulses to the decade counter #1. No pulses are initially introduced to the other decade counters #2–#5 because of the disabled condition of the "and" gates 102, 104, 106 and 108. However, when the decade counter #1 reaches the 1001 configuration, the "and" gate 102 is enabled, so that the next pulse from the single-shot multivibrator 100 causes the decade counter #2 to step from the 0000 to the 0001 configuration. This latter pulse also causes the decade counter #1 to return to the 0000 configuration.

Therefore, the decimal "unit" digits are counted in the decade counter #1; the decimal "ten" digits are counted in the decade counter #2; the decimal "100" digits are counted in the decade counter #3; the decimal "1,000" digits are counted in the decade counter #4; and the decimal "10,000" digits are counted in the decade counter #5.

The flip-flops of the decade counter #1 are connected to a binary-to-decimal switch #1. This binary-to-decimal switch is controlled by the dial 30 of FIGURE 1. This switch may have any usual circuit configuration, and it has four output leads connected to an "and" gate 101. When the dial 30 is set to "1," the switch #1 produces true output terms on all its output leads when the configurations of the flip-flops F1–F4 in the decade counter #1 correspond to "1" in the decimal base system. The "and" gate 101 is enabled, therefore, only when the flip-flops have such a configuration. Likewise, any other setting of the dial 30 requires a corresponding set of configurations of the flip-flops F1–F4 in the decade counter #1 before the "and" gate 101 is enabled.

In like manner, the flip-flops F1–F4 of the decade counter #2 are connected to a binary-to-decimal switch #2; the flip-flops F1–F4 of the decade counter #3 are connected to a binary-to-decimal switch #3; the flip-flops F1–F4 of the decade counter #4 are connected to a binary-to-decimal switch #4, and the flip-flops F1–F4 of the decade counter #5 are connected to a binary-to-decimal switch #5. Each binary-to-decimal switch has four output leads, and these are connected to respective "and" gates 103, 105, 107 and 109. In each instance, the output signals produced by the different binary-to-decimal switches #2–#5 are set true to enable the corresponding "and" gates when the configuration of the flip-flops of the corresponding decade counter reach a particular count corresponding to the setting of the respective dials 32, 34, 36 and 38, and remain true only so long as the corresponding counter has a configuration corresponding to that decimal count.

The binary-to-decimal switches #1–#5 are controlled, as mentioned, by the respective dials 30, 32, 34, 36, 38 of FIGURE 1. Therefore, when it is desired to cause the frequency divider 20 to operate with a pre-set division ratio, the different dials 30, 32, 34, 36 and 38 are set to the different digits of a number representing, for example, the desired frequency on a digital representation of that frequency.

As the counters #1–#5 of the frequency divider 20 reach the configurations corresponding to the settings of the dials 30, 32, 34, 36, 38 of the binary-to-decimal switches #1–#5, the "and" gates 101, 103, 105, 107 and 109 are enabled, as explained above. The output signals from the "and" gates are all applied to a coincidence gate 110, and the coincidence gate 110 passes an output signal to an inverter amplifier 112. The signal is passed to the inverter amplifier 112 only when all the signals from the binary-to-decimal switches #1–#5 happen to be in a true state. This occurs only when the decade counter #5 reaches a state corresponding to the setting of the dial 38; the decade counter #4 has been actuated to a configuration corresponding to the setting of the dial 36; the decade counter #3 has been actuated to a configuration corresponding to the setting of the dial 34; the decade counter #2 has been actuated to a configuration corresponding to the setting of the dial 32; and then, as the successive pulses applied to the decade counter #1 cause that counter to move successively from one configuration to the next, the moment that the decade counter #1 reaches the configuration corresponding to the setting of the dial 30, the coincidence gate 110 is enabled. This permits the next pulse from the single-shot multivibrator 100 to pass through the coincidence gate 110, and through the inverter amplifier 112 to a one-shot multivibrator 114. This pulse is also applied to a re-set line 116 which is connected to all the decade counters 1–5 and returns each of the decade counters to its 0000 position.

Therefore, the one-shot multivibrator 114 is actuated by a pulse which has a division ratio with respect to the reference input pulses from the single-shot multivibrator 100, as established by the digital settings of the dials 30, 32, 34, 36 and 38. The output from the one-shot multivibrator 114 is applied to the one-shot multivibrator 18 of FIGURE 1 which, in turn, applies its output to the phase detector 14, as explained above. The pulses from the multivibrator 114 are relatively narrow since each must terminate, for proper re-setting of the counters #1–#5, before the next succeeding input pulse from the single-shot multivibrator 100. The one-shot multivibrator 18 responds to the relatively narrow pulses from the multivibrator 114 to apply the relatively broad pulses of FIGURES 2A and 2B to the phase detector 14.

Figures 5, 6:
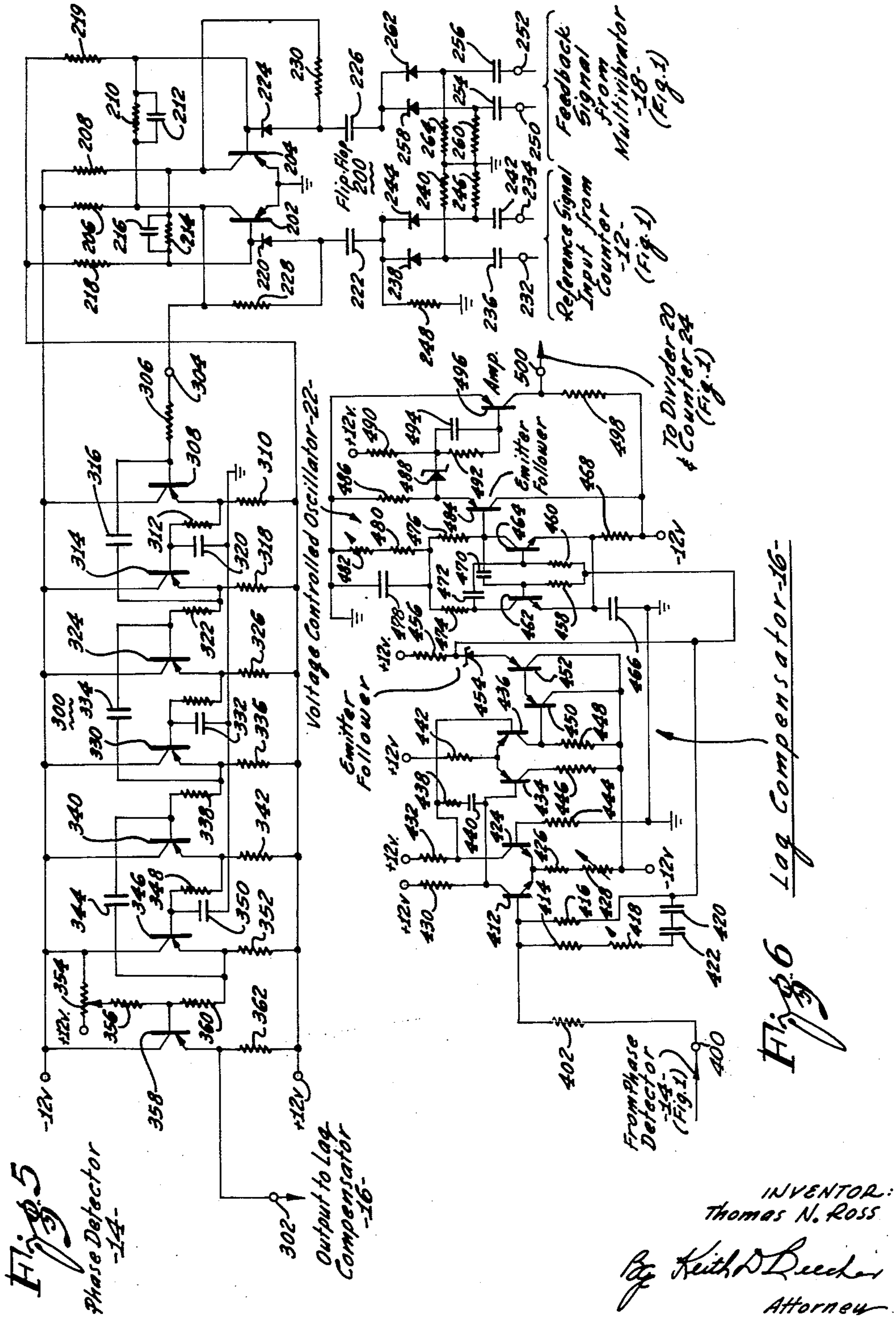
FIGURE 5 is a circuit diagram of a phase detector component included in the system of FIGURE 1.
FIGURE 6 is a circuit diagram of a filter and oscillator component of the system of FIGURE 1.

The circuit details of one embodiment of the phase detector 14 of FIGURE 1 are shown in FIGURE 5. As illustrated in FIGURE 5, the phase detector includes a bi-stable multivibrator, or flip-flop, 200. This bi-stable multivibrator is formed of a pair of PNP transistors 202 and 204. The emitters of these transitsors are grounded. The collector of the transistor 202 is connected to a resistor 206 which may have a resistance, for example, of 2.2 kilo-ohms, the resistor 206 being connected to the negative terminal of a 12 volt direct voltage source. The collector of the transistor 204 is connected to a resistor 208. This latter resistor may also have a resistance of 2.2 kilo-ohms, and it also is connected to the negative terminal of the 12 volt direct voltage source.

The collector of the transistor 202 is connected back to the base of the transistor 204 through a resistor 210. The resistor 210 may have a resistance of 22 kilo-ohms, and it is shunted by a capacitor 212. In like manner, the collector of the transistor 204 is connected back to the base of the transistor 202 through a resistor 214. The resistor 214 may also have a resistance of 22 kilo-ohms, and it is shunted by a capacitor 216. The transistors 202 and 204 may be of the type presently designated 2N404.

The base of the transistor 202 is connected through a resistor 218 to the positive terminal of the 12 volt direct voltage source, and the base of the transistor 204 is connected through a resistor 219 to the positive terminal of that source. Both the resistors 218 and 219 may have a resistance of 120 kilo-ohms. A diode 220 has its cathode connected to the base of the transistor 202, and the anode of the diode 220 is connected to a capacitor 222. Likewise, a diode 224 has its cathode connected to the base of the transistor 204, and the anode of the latter diode is connected to a capacitor 226.

A resistor 228 is connected to the collector of the transistor 202 and to the anode of the diode 220. Likewise, a resistor 230 is connected to the collector of the transistor 204 and to the anode of the diode 224. Each of the resistors 228 and 230 may have a resistance, for example, of 15 kilo-ohms.

The flip-flop 200 includes a pair of input terminals 232 and 234. These input terminals receive the reference input signal from the counter 12, and the complement of this signal. The input terminal 232 is connected to a capacitor 236 which, in turn, is connected to the anode of a diode 238 and to a grounded resistor 240. The capacitor 236 may have a capacity of 180 micro-micro-farads, and the resistor 240 may have a resistance of 10 kilo-ohms. The input terminal 234 is connected to a capaictor 242 which, in turn, is connected to the anode of a diode 244 and to a grounded resistor 246. The capacitor 242 may have a capacity, for example, of 180 micro-microfarads, and the resistor 246 may have a resistance of 10 kilo-ohms.

The cathodes of the diodes 238 and 244 are connected to the capacitor 222 and to a grounded resistor 248. The resistor 248 may, for example, have a resistance of 100 kilo-ohms.

The flip-flop 200 also has a pair of input terminals 250 and 252. The input terminals 250 and 252 receive the feedback signal from the multivibrator 18 of FIGURE 1, and its complement. The input terminals 250 and 252 are respectively connected to a pair of capacitors 254 and 256. The capacitor 254 is connected to the anode of a diode 258 and to a grounded resistor 260. The capacitor 256 is connected to the anode of a diode 262 and to a grounded resistor 264.

The cathodes of the diodes 258 and 262 are connected to the capacitors 222 and 226. Each of the capacitors 254 and 256 may have a capacity, for example, of 180 micro-microfarads. Each of the resistors 260 and 264 may have a resistance, for example, of 10 kilo-ohms.

The capacitor 236 and resistor 240 form a first differentiating network for the reference input pulses from the counter 12. The capacitor 242 and resistor 246 form a second differentiating network for the complement of the reference pulse signal from the counter 12. The resulting differentiated signals appearing across the resistors 240 and 246 each have positive-going and negative-going spikes. Only the positive-going spikes are passed by the respective diodes 238 and 244 to the input of the flip-flop 200. This means that a positive-going spike is passed to the input of the flip-flop 200 at the leading edge of each reference pulse, and a positive-going spike is also introduced to the flip-flop at the trailing edge of each reference pulse.

Likewise, the capacitor 254 and resistor 260 form a differentiating network, and the capacitor 256 and resistor 264 form a differentiating network. These latter differentiating networks act on the feedback pulse signal from the multivibrator 18. The resulting differentiated signals, in conjunction with the diodes 258 and 260 cause a positive-going spike to be introduced to the input of the flip-flop 200 at the leading edge of each feedback pulse and a positive-going spike to be introduced to the input of the flip-flop at the trailing edge of each feedback pulse.

As shown by the waveform in FIGURES 2A and 2B, the leading trailing edges of each pulse of the reference signal cause the flip-flop 200 to be triggered to one of its stable states, and the leading and trailing edges of each pulse of the feedback pulse signal cause the flip-flop 200 to be triggered to its second stable state. Therefore, the relative time in which the flip-flop 200 remains in its two stable states is dependent upon the phase relationship between the reference signal input and the feedback signal input.

As shown in FIGURE 2A, when the two input signals have the same frequency and a 90° displacement, the resulting output signal from the flip-flop 200 has the configuration of a rectangular wave in which the time duration of each positive half-cycle is equal to the time duration of each negative half-cycle, so that the resulting average amplitude level has a reference level. When the phase relationship between the reference signal and the feedback signal shifts for any reason, and as shown in FIGURE 2B, the times in which the flip-flop 200 is in one of its stable states are different in duration from the times in which it is in the other of its stable states. This, as shown in FIGURE 2B, results in an output signal having a rectangular configuration, but in which certain half-cycles have a longer duration than the other half-cycles. For the latter waveform, the average amplitude may be considered as increasing in a positive sense from the average reference level of the output signal of FIGURE 2A.

It will be appreciated, therefore, that phase detection is accomplished in the phase detector 14 by the use of a modified bistable multivibrator. As described, the reference pulse signal and the primary feedback pulse signal, and their complements, are differentiated and mixed before being applied to the input of the flip-flop. Then, when the two inputs are at exactly the same frequency and 90° out of phase, the average direct current value of the flip-flop output has a particular amplitude. Then, if one of the input signals shifts in phase or frequency, the resulting average amplitude of the output signal will shift on either side of the previously established amplitude, and in a direction corresponding to the shift in phase or frequency.

The output signal from the flip-flop 200 is passed through a low-pass filter 300, which serves to remove the high frequency components of the output signal. The filter 300 has the important characteristics of imparting negligible phase shift to the signals translated thereby, and negligible direct current amplification. The output of the filter 300 appears at an output terminal 302, and this output is the direct current average of the output signal from the flip-flop 200. The filter 300 is an active resistance-capacity transistorized network.

The filter 300 has an input terminal 304 which is connected to the output circuit of the flip-flop 200. This flip-flop output circuit is formed, for example, by the resistors 206 and 228, the input terminal 304 being connected to the junction of that resistor and the collector of the transistor 202. The input terminal 304 of the low-pass filter is connected to a resistor 306 which may have a resistance of 22 kilo-ohms. The resistor 306 is connected to the base of a PNP transistor 308. This transistor, and others to be referred to in the filter network, may be of the type presently designated 2N494. The collector of the transistor 308 is connected to the negative terminal of the 12 volt direct voltage source, and the emitter of the transistor is connected to a resistor 310. The resistor 310 may, for example, have a resistance of 10 kilo-ohms.

The emitter of the transistor 308 is connected through a resistor 312 to the base of a PNP transistor 314. The base of the transistor 308 is connected through a capacitor 316 to the emitter of the transistor 314. The emitter of the transistor 314 is connected through a resistor 318 to the positive terminal of the 12 volt direct voltage source. The base of the transistor 314 is connected to a grounded capacitor 320. The resistor 312 may have a resistance of 22 kilo-ohms, the capacitor 320 may have a capacity of 3.9 microfarads, and the capacitor 320 may have a capacity of 1.35 microfarads.

The emitter of the transistor 314 is connected through a resistor 322 to the base of a PNP transistor 324. The collector of the transistor 324 is connected to the negative terminal of the 12 volt direct voltage source. The emitter of the transistor 324 is connected to a resistor 326 which, in turn, is connected to the positive terminal of the 12 volt direct voltage source. The resistor 322 may have a resistance of 22 kilo-ohms, and the resistor 326 may have a resistance of 10 kilo-ohms.

The collector of the transistor 324 is connected to the negative terminal of the 12 volt direct voltage source. The emitter of the transistor 324 is connected through a resistor 328 to the base of a PNP transistor 330. The base of the transistor 330 is connected to a grounded capacitor 332. The base of the transistor 324 is connected through a capacitor 334 to the emitter of the transistor 330. The emitter of the transistor 330 is connected to a resistor 336 which, in turn, is connected to the positive terminal of the 12 volt direct voltage source. The resistor 328 has a resistance, for example, of 22 kilo-ohms, the capacitor 332 may have a capacity of 1.35 microfarads, the capacitor 334 may have a capacity of 3.9 microfarads, and the resistor 336 may have a resisctance of 10 kilo-ohms.

The emitter of the transistor 330 is connected through a resistor 338 to the base of a PNP transistor 340. The emitter of the transistor 340 is connected to a resistor 342 which, in turn, is connected to the positive terminal of the 12 volt direct voltage source. The resistor 338 may, for example, have a resistance of 22 kilo-ohms, and the resistor 342 may have a resistance of 10 kilo-ohms.

The collector of the transistor 340 is connected to the negative terminal of the 12 volt direct voltage source. The base of the transistor 340 is connected through a capacitor 344 to the emitter of a PNP transistor 346. The base of the transistor 346 is connected through a resistor 348 to the emitter of the transistor 340. The base of the transistor 346 is connected to a grounded capacitor 350, and the emitter of the transistor 346 is connected through a resistor 352 to the positive terminal of the 12 volt direct voltage source. The capacitor 344 may have a capacity, for example, of 1.35 microfarads, the resistor 348 may have a resistance of 22 kilo-ohms, the capacitor 350 may have a capacity, for example, of 1.35 microfarads, and the resistor 352 may have a resistance of 10 kilo-ohms.

The collector of the transistor 346 is connected to the negative terminal of the 12 volt direct voltage source, and to one side of a potentiometer 354. The other side of the potentiometer 354 is connected to the positive terminal of the 12 volt direct voltage source. The movable arm of the potentiometer 354 is connected to a resistor 356 which, in turn, is connected to the base of a transistor 358. The potentiometer 354 may have a resistance of 10 kilo-ohms, and the resistor 356 may have a resistance of 150 kilo-ohms. The base of the transistor 358 is connected through a resistor 360 to the emitter of the transistor 346. The resistor 360 may, for example, have a resistance of 33 kilo-ohms. The emitter of the transistor 358 is connected through a resistor 362 to the positive terminal of the 12 volt direct voltage source. The resistor 362 may have a resistance of 10 kilo-ohms. The collector of the transistor 358 is connected to the negative terminal of the 12 volt direct voltage source. The emitter of the transistor 358 is also connected to the output terminal 302 of the low-pass filter 300.

The active low-pass filter 300 is of the general type described, for example, in Electronics, May 13, 1960, at page 82, in an article entitled "Selecting R-C Values for Active Filters" by R. E. Bach, Jr.

The low-pass filter 300, as noted above, serves to filter out the high frequency components of the output signals from the phase detector 14. This particular type of filter is most suited for the disclosed purpose in that, as mentioned above, it has low phase shift and low direct current amplification characteristics.

The low-pass filter 300 does not provide the loop with the desired second order characteristics, and these second order characteristics are provided by the lag compensator network 16. The lag compensator network 16 is a proportional plus integral compensator. It approximates the well known desired transfer function of $$\frac{\tau_2 S+1}{\tau_1 S}$$

this being achieved by use of a high gain direct current amplifier with series and feedback impedances as shown in the circuit diagram of FIGURE 6. The proportional plus-integral filters, per se, are known to the art. Such a filter is described, for example, in an article by W. O. Brooks, entitled "Stepping Up Frequency With Counter Circuits," appearing in the July 17, 1959, edition of Electronics Magazine. Reference is also made to an article by W. J. Gruen entitled "Theory of AFC Synchronization" appearing in the Proceedings of the I.R.E., August 1956.

The circuit diagram of FIGURE 6 includes appropriate circuitry for the lag compensator 16, and the circuit diagram also includes appropriate circuitry for a transistorized version of the voltage controlled oscillator 22. As noted, the voltage controlled oscillator may be any suitable monostable multivibrator, or other type of monostable relaxation oscillator. The direct current control signal from the lag compensator 16 is applied to the base return resistors of the voltage controlled oscillator to control the frequency thereof.

The lag compensator 16 includes an input terminal 400 which is connected to the output terminal 302 of the phase detector circuit 14 of FIGURE 5 to receive the control signal from the phase detector.

The input terminal 400 is connected to a resistor 402 which forms the series resistor for the lag compensator and which may, for example, have a resistance of 56 kilo-ohms. The resistor 402 is connected to the base of an NPN transistor 412. This transistor may be of the type presently designated 2N13104.

The base of the transistor 412 is also connected to a resistor 414 and to a resistor 416. The resistor 414 may have a resistance of 15 kilo-ohms, for example, and it is connected to a variable resistor 418. The variable resistor 418 may have a resistance of 10 kilo-ohms. The resistor 416 may have a resistance of 1 megohm, and it is connected to a capacitor 420. The capacitor 420 is connected to a capacitor 422 which, in turn, is connected to the variable resistor 418. The capacitors 420 and 422 may each have a capacity, for example, of 39 microfarads.

The emitter of the transistor 412 is connected to the emitter of a similar NPN transistor 424. These common emitters are connected to a resistor 426 which, in turn, is connected through a variable resistor 428 to the negative terminal of a 12 volt direct voltage source. The resistor 426 may have a resistance, for example, of 15 kilo-ohms, and the variable resistor 428 may have a resistance of 10 kilo-ohms. The collector of the transistor 412 is connected through a resistor 430 to the positive terminal of the 12 volt direct voltage source, and the collector of the transistor 424 is connected through a resistor 432 to that terminal. Each of the resistors 430 and 432 may have a resistance, for example, of 27 kilo-ohms.

The collector of the transistor 412 is connected to the base of a PNP transistor 434, and the collector of the transistor 424 is connected to the base of a PNP transistor 436. Each of these transistors may be of the type presently designated 2N404. The base of the transistor 436 is connected through a resistor 438 and series capacitor 440 to the base of the transistor 434. The resistor 438 may have a resistance of 15 ohms, and the capacitor 440 may have a capacity of .01 microfarad.

The emitters of the transistors 434 and 436 are connected through a common resistor 442 to the positive terminal of the 12 volt direct voltage source. This resistor, for example, may have a resistance of 5.1 kilo-ohms.

The base of the transistor 424 is connected to a grounded resistor 444 which may, for example, have a resistance of 56 kilo-ohms. The collector of the transistor 434 is connected through a resistor 446 to the negative terminal of the 12 volt direct voltage source, and the collector of the transistor 436 is connected through a resistor 448 to that terminal. The resistors 446 and 448 may each have a resistance of 10 kilo-ohms.

The signal appearing across the resistor 448 is introduced to the base of a transistor 450. The transistor 450 and an additional transistor 452 are connected as an emitter follower circuit. The collector of the transistor 450 is connected to the negative terminal of the 12 volt direct voltage source, as is the collector of the transistor 452. The emitter of the transistor 450 is connected to the base of the transistor 452. The emitter of the transistor 452 is connected to the anode of a Zener diode 454. This diode may be of the type presently designated 1N705. The cathode of the diode is connected through a resistor 456 to the positive terminal of the 12 volt direct voltage source. The resistor 456 may have a resistance of 1.5 kilo-ohms. The junction of the resistor 456 and the emitter of the transistor 454 is connected back to the capacitor 420. The above-described circuitry of the transistors 412, 424, 434, 436, 450 and 452 constitutes the lag compensator 16.

The above-mentioned junction is further connected to the base return resistors 458 and 460 of the network of the voltage controlled oscillator 22. This voltage controlled oscillator, as mentioned above, is in the illustrated embodiment an astable transistorized multivibrator. The multivibrator includes a pair of NPN transistors 462 and 464. These transistors may be of the type presently designated 2N706A.

The emitters of the transistors 462 and 464 are connected together and to a grounded capacitor 466 and a resistor 468. The resistor 468, in turn, is connected to the negative terminal of the 12 volt direct voltage source. The base of the transistor 462 is connected to the resistor 458 and to a capacitor 470. The base of the transistor 464 is connected to the resistor 460 and to a capacitor 472. The capacitor 470 is connected to the collector of the transistor 464, and the capacitor 472 is connected to the collector of the transistor 462.

The collector of the transistor 462 is further connected to a resistor 474, and the collector of the transistor 464 is further connected to a resistor 476. The resistors 474 and 476 are connected to a grounded capacitor 478. This capacitor is shunted by a resistor 480 and a series variable resistor 482. The resistors 474 and 476 may each have a resistance of 1 kilo-ohm, the capacitor 478 may have a capacity of 1 microfarad, the resistor 480 may have a resistance of 120 ohms, and the variable resistor 482 may have a resistance of 100 ohms. The signal introduced to the resistors 458 and 460 controls the operating frequency of the voltage controlled oscillator.

The resulting pulse output signal from the voltage controlled oscillator is applied to the base of a PNP transistor 484. This latter transistor is connected as an emitter follower. The collector of the transistor is connected to the negative terminal of the 12 volt direct voltage source, and the emitter of the transistor is connected to a grounded resistor 486. The resistor 486 may, for example, have a resistance of 10 kilo-ohms. The emitter of the transistor 484 is also connected to the anode of a Zener diode 488. The cathode of the diode is connected to the junction of a pair of resistors 490 and 492. The resistor 490 may have a resistance of 120 kilo-ohms, for example, and the resistor 492 may have a resistance of 812 kilo-ohms. The resistor 492 is shunted by a capacitor 494, and the capacitor may have a capacity of 82 micro-microfarads.

The resistor 492 and capacitor 494 are connected to the base of a PNP transistor 496. This transistor is connected as an amplifier. The emitter of the transistor 496 is grounded, and the collector is connected through a resistor 498 to the negative terminal of the 12 volt direct voltage source. The resistor 498 may have a resistance of 2.2 kilo-ohms. The transistors 484 and 496 may be of the type designated 2N1499A.

The Zener diode 454 functions as an amplitude shifter for the direct current voltage level. This diode serves to maintain the output voltage level of the lag compensator at zero, when the input voltage is zero. The Zener diode 454, therefore, serves to compensate for any tendency for the lag compensator to provide a direct current potential shift.

The Zener diode 488 serves to shift the direct current voltage level at the output of the voltage controlled oscillator from a $-6$ volt to $-12$ volt range, for example, to a $\pm 2$ volt to $-4$ volt range. This serves as a convenient circuit to drive the transistor 496 between its conductive and cut-off states without any attenuation in the process.

The amplified output signal from the transistor 496 is applied to an output terminal 500. As described in conjunction with FIGURE 1, this output signal is introduced to the adjustable frequency divider 20, and also to the counter 24.

In the manner described, therefore, a closed loop is formed by the adjustable frequency divider 20, the phase detector 14, and the voltage controlled oscillator 22, of FIGURE 1. The adjustable frequency divider is set to a desired setting, and the loop functions to cause the voltage controlled oscillator to oscillate at a frequency corresponding to that setting in the manner described above.

The invention provides, therefore, an improved oscillator system which combines a unique automatic phase control network with a digital network to generate extremely stable signal frequencies up to, for example, 1 megacycle. As mentioned above, the generated frequency may be controlled with a precision, for example, to five digits or more.

By the use of the oscillator system of the invention, accurate selection of any frequency in the operating range may be obtained directly by the front panel settings of the dials 30, 32, 34, 36 and 38 in FIGURE 1.

The oscillator system, or signal generator, of the invention provides, for example, means for rapidly obtaining numerous, precise calibration points, without the need for a frequency counter. As an example, the oscillator system of the invention may find extensive use in the measurement, calibration of frequency modulation telemetry systems. However, it is evident, that the instrument of the invention will find general utility in any application where a range of precise signal frequencies is required.

While a particular embodiment of the invention has been shown and described, it is evident that modifications may be made. The following claims are intended to cover such modifications as fall within the scope of the invention.

What is claimed is:

1. A signal generator including: signal producing means including a reference signal oscillator for producing a reference pulse signal having a predetermined repetition frequency; a voltage controlled pulse generating oscillator responsive to an applied direct current control signal for producing an output pulse signal having a repetition frequency determined by the amplitude of the applied direct current control signal; a phase-detector circuit coupled to said signal producing means; means coupling said voltage controlled oscillator to said phase-detector circuit for introducing a feed-back pulse signal thereto, said phase-detector circuit responding to said reference signal and to said feedback signal for producing a control signal having an average amplitude determined by the relative phase displacement of said reference signal and said feedback signal; active low pass, low phase shift and low direct current amplification filter means coupled to said phase-detector circuit for removing the high frequency components of the output signal produced by said phase detector so as to produce a direct current control signal having an amplitude corresponding to the relative phase of said reference pulse signal and said feedback pulse signal; network means coupled to said filter means and interposed between said filter means and said voltage controlled oscillator for introducing said direct current control signal to said voltage controlled oscillator, said network means including a proportional-plus-integral lag compensator network for providing second order characteristics to the system; frequency divider means included in said coupling means for causing the frequency of said feedback signal to be a predetermined sub-multiple of the frequency of said output signal of said voltage controlled oscillator, said frequency divider means including pulse counter means and manually operable switching means for causing said frequency divider means to produce an output signal after a predetermined count by said pulse counter means as established by the setting of said switching means so as to control the frequency division ratio of said frequency divider means and thereby adjust the frequency of said voltage controlled oscillator throughout an established frequency range.

2. The signal generator defined in claim 1 and which includes an output circuit coupled to said voltage controlled oscillator, and which further includes a plurality of frequency dividers and a range selector switch for selectively placing the frequency dividers of said plurality into operative circuit relationship, so as to enable said output circuit to produce a signal frequency having a predetermined sub-multiple relationship to the frequency of said output signal from said voltage controlled oscillator.

References Cited in the file of this patent

UNITED STATES PATENTS

| | | |
|---|---|---|
| 2,387,544 | Usselman | Oct. 23, 1945 |
| 2,627,033 | Jensen et al. | Jan. 27, 1953 |
| 2,963,648 | Baskin et al. | Dec. 6, 1960 |
| 2,982,921 | Rozner et al. | May 2, 1961 |